(12) United States Patent
Laor

(10) Patent No.: US 8,071,066 B1
(45) Date of Patent: Dec. 6, 2011

(54) METHOD AND APPARATUS FOR IMPROVING THE QUALITY OF DIAMONDS AND OTHER GEMSTONES

(75) Inventor: Herzel Laor, Boulder, CO (US)

(73) Assignee: Laor Consulting, LLC, Denver, CO (US)

( * ) Notice: Subject to any disclaimer, the term of this patent is extended or adjusted under 35 U.S.C. 154(b) by 198 days.

(21) Appl. No.: 12/370,412

(22) Filed: Feb. 12, 2009

Related U.S. Application Data

(60) Provisional application No. 61/028,411, filed on Feb. 13, 2008.

(51) Int. Cl.
*B01J 3/06* (2006.01)
*B05D 3/12* (2006.01)
*A44C 25/00* (2006.01)

(52) U.S. Cl. .............. 423/446; 427/240; 63/32

(58) Field of Classification Search .............. None
See application file for complete search history.

(56) References Cited

U.S. PATENT DOCUMENTS

| | | | |
|---|---|---|---|
| 4,058,430 A | 11/1977 | Suntola et al. | |
| 4,389,973 A | 6/1983 | Suntola et al. | |
| 4,767,494 A | 8/1988 | Kobayashi et al. | |
| 5,225,366 A | 7/1993 | Yoder | |
| 5,281,274 A | 1/1994 | Yoder | |
| 5,404,835 A | 4/1995 | Yoder | |
| 5,483,919 A | 1/1996 | Yokoyama et al. | |
| 5,814,149 A | 9/1998 | Shintani et al. | |
| 6,015,590 A | 1/2000 | Suntola et al. | |
| 6,713,177 B2 | 3/2004 | George et al. | |
| 6,913,827 B2 | 7/2005 | George et al. | |
| 7,029,777 B2 | 4/2006 | Mardilovich et al. | |
| 7,104,859 B2 | 9/2006 | Tsukamoto et al. | |
| 7,201,886 B2 | 4/2007 | Linares et al. | |
| 7,250,083 B2 | 7/2007 | Sneh | |
| 7,258,741 B2 | 8/2007 | Linares et al. | |
| 2003/0026989 A1 | 2/2003 | George et al. | |
| 2006/0172179 A1 | 8/2006 | Gu et al. | |
| 2007/0234539 A1 | 10/2007 | Lee et al. | |
| 2007/0271751 A1 | 11/2007 | Weidman | |

OTHER PUBLICATIONS

Taylor et al.; Single Crystal Diamond M-i-P Diodes for Power electronics; IET circuits Devices Syst.; 1(5), pp. 380-386; 2007.*
Takahashi et al.; Atomic Layer Growth and Characterization of ZnO Thin films; Phys. Stat. Sol. (b); 229, No. 2, pp. 925-929; 2002.*
U.S. Appl. No. 12/370,394, filed Feb. 12, 2009, Laor.
"Atomic Layer Deposition", Wikipedia, available at http://en.wikipedia.org/wiki/Atomic_layer_deposition, accessed Dec. 9, 2008, 4 pages.

(Continued)

*Primary Examiner* — Melvin Mayes
*Assistant Examiner* — Guinever Gregorio
(74) *Attorney, Agent, or Firm* — Sheridan Ross P.C.

(57) ABSTRACT

The present disclosure relates to methods for improving the quality of diamonds by eliminating internal defects, such as cracks and vacant volumes, without the use of filler materials such as glass, thereby improving the diamond's optical performance or appearance. More particularly, the disclosure relates to a method of curing defects in a genuine or synthetic diamond or other gemstone by using Atomic Layer Deposition ("ALD") processes to form atomic layers within vacant volumes or cracks in the diamond or gemstone. Alternatively, ALD may be used to form crystalline layers of a new diamond or other gemstone.

5 Claims, 2 Drawing Sheets

OTHER PUBLICATIONS

"Atomic Layer Epitaxy", Wikipedia, available at http://en.wikipedia.org/wiki/Atomic_layer_epitaxy, accessed Dec. 9, 2008, 1 page.

"Chemical vapor deposition of diamond", Wikipedia, available at http://en.wikipedia.org/wiki/Chemical_vapor_deposition_of_diamond, accessed Dec. 19, 2008.

"Executive Summary", NEMI Technology Roadmans, Dec. 2002, pp. 1-50, available at http://www.nemi.org/roadmapping/Executive_Summary.pdf.

"Introduction & Atomic Layer Deposition", 3 pages, date unknown.

"Real big Diamonds made real fast", May 16, 2005, available at http://www.scienceblog.com/cms/node/7908.

"Technology Backgrounder: Atomic Layer Deposition", ICKnowledge LLC, 2004, 7 pages.

Atomic Layer Deposition (ALD), Oxford Instruments, date unknown, 2 pages.

Atomic Layer Deposition, available at http://www.oxford-instruments.com/wps/wcm/connect/Oxford+Instruments/Groups/Application+Groups/Deposition+and+growth/Atomic+layer+deposition+(ALD), 2007.

Atomic Layer Deposition, http://www.cambridgenanotech.com/papers/Atomic%20Layer%20Deposition%20tutorial%20Cambridge% 20NanoTech%20Inc.pdf, 40 pages, date unknown.

Biercuk et al., "Low-temperature atomic-layer-deposition lift-off method for microelectronic applications", Applied Physics Letters, vol. 83, No. 12, Sep. 22, 2003, 3 pages.

Carcia et al., Ca test of Al2O3 gas diffusion barriers grown by atomic layer deposition on polymers, Applied Physics Letters, 89, Issue 3, 031915, 2006.

Chiba et al., "Electric-field control of ferromagnetism in (Ga,Mn)As", Applied Physics Letter 89, 162505 (2006).

Fan et al., "Monocrystalline spinel nanotube fabrication based on the Kirkendall effect", Nature Materials 2007 Published online: Jul. 2, 2006; doi:10.1038/nmat1673.

Fan et al., "Patterned growth of aligned ZnO nanowire arrays on saphire and GaN layers", Superlattices and Microstructures 36 (1-3), p. 95-105 (2004).

Hausmann et al., Highly conformal atomic layer deposition of tantalum oxide using alkylamide precursors, Thin Solid Films 443 (2003) 1-4.

http://www.cambridgenanotech.com/products/products.php, 1 page, 2008.

Huang et al., "Controlled Replication of Butterfly Wings for Achieving Tunable Photonic Properties", Nano Letters 2006, vol. 6, No. 10, 2325-2331.

Knez et al., "Atomic layer deposition on biological macromolecules", ECS Transactions 3 (15), p. 219-225 (2007).

Knez et al., "Atomic Layer Deposition on Biological Macromolecules: Metal Oxide Coating of Tabacco Mosaic Virus and Ferritin", Nano Lett. 6, No. 6, 1172 (2006).

Lu et al., "Undoped high mobility two-dimensional hole-channel GaAs/Al$x$Ga1-$x$As heterostructure filed-effect transistors with atomic-layer-deposited dielectric", Appl. Phys. Lett. 90, 112113 (2007).

Park et al., "Characteristics of Organic Light Emitting Diodes with Al-Doped ZnO Anode Deposited by Atomic Layer Deposition", Japanese Journal of Applied Physics, 2005, vol. 44, No. 7, pp. L242-L245.

Ulrich et al., "Putting Passives in their Place", IEEE Spectrum, Jul. 2003, p. 26-30.

www.beneq.com, 1 page, 2009.
www.cambridgenanotech.com, 1 oage, 2008.
www.oxford-instruments.com, 1 page, 2009.
Zaitsu et al., Applied Physics Letters, 80, 2442, 2002.

* cited by examiner

METHOD AND APPARATUS FOR IMPROVING THE QUALITY OF DIAMONDS AND OTHER GEMSTONES

CROSS REFERENCE TO RELATED APPLICATIONS

The present application claims the benefit of U.S. Provisional Patent Application No. 61/028,411, filed Feb. 13, 2008, the entire content of which is incorporated herein by reference.

FIELD OF THE INVENTION

The present invention relates generally to the field of sequential surface chemistry, and more specifically, a method for improving the quality of diamonds and other gemstones and diamonds and gemstones produced thereby.

BACKGROUND OF THE INVENTION

Diamonds and other gemstones are commonly used both for cosmetic applications in the jewelry industry and for industrial applications, such as cutting, drilling, grinding, and polishing.

We will refer below mostly to diamonds, however, the discussion is the same for other gemstones made of other materials. Due in part to the increased demand for such applications and the relatively high price for even small sized diamonds, synthetic diamond industries are rapidly growing. Despite the growth in the synthetic diamond market, sales of natural diamonds have remained steady or have grown over the past 10 years. As such, there is a large market demand for both natural and synthetic diamonds.

In the jewelry industry, the value of a diamond, sapphire, etc., depends at least partially on its optical performance, or clarity. Diamonds that are absolutely clear are typically the most expensive and the most sought-after. However, most diamonds have internal imperfections, such as cracks, inclusions and vacant volumes that detract from the diamond's value and beauty. These defects reflect or absorb light incident on the defect's surface and are visible to the consumer. A crack has two surfaces that reflect light, and approximately 17% of the light incident on a crack is reflected due to the high refractive index of the diamond. Such defects reduce the value of a diamond significantly. These defects may also reduce a diamond's value in industrial applications too, including by increasing the risk of failure due to breaking along cracks or flaw lines.

It is therefore often necessary or desirable to improve the quality of a diamond or other gemstone by eliminating internal defects, and thereby improve a diamond's optical performance. Typically, inclusions inside diamonds are treated by drilling a hole to the defect with a laser and dissolving the inclused material with hot acids. This process leaves a vacant volume. Some diamond dealers fill cracks and vacant volumes with high refractive index glass to minimize the reflection and the visibility of these defects. However, diamonds having fillers are less valuable then diamonds without fillers. There are known chemical processes relied upon in the jewelry industry for improving a diamond's appearance. CVD has previously been used to grow single crystal diamonds. CVD involves feeding various amounts of gases into a chamber while providing the conditions necessary for carbon atoms in a gas to settle on a substrate in crystalline form. However, CVD diamond layer thickness may not be accurate and is frequently difficult to control.

Current efforts have been made to grow a single crystal diamond (outside of the high pressure furnace crystallization) using CVD technology. For example, the Carnegie Institute's Geophysical Laboratory can produce a 10 carat (2 g) single-crystal diamond rapidly (28 nm/s) by CVD, as well as a colorless single-crystal diamond. Growth of colorless diamonds up to 60 g (300 carats) is believed achievable using their method. (See http://www.scienceblog.com/cms/node/7908, which is incorporated herein by reference in its entirety.)

But despite the above mentioned methods, there remains a need for a relatively simple, repeatable, inexpensive and otherwise economical method for improving the quality of diamonds and other precious stones.

SUMMARY

Certain embodiments of the present invention are directed to improving the quality of diamonds and the manufacturing of synthetic diamonds. The present invention relates generally to the field of sequential surface chemistry. More specifically, it relates to products and methods for manufacturing products using Atomic Layer Deposition ("ALD") to depose one or more layers of a desirable materials onto a surface. ALD is considered to demonstrate improved capability for high-quality, atomic-scale film depositions at low temperatures. The ALD technology was developed in part for the purposes of targeting deposition of materials for Silicon integrated circuit ("IC") production, but may be used in applications other then Silicon IC manufacturing. (See Appendix A to the U.S. Provisional Patent Application No. 61/028,411 for details related to ALD technology, the contents of which are incorporated by reference herein in its entirety.)

ALD is generally known, and is conventionally been used in the fabrication of microelectronics. ALD is a self-limiting deposition technique in which one atomic or molecular layer of a material is deposited, typically onto a substrate, each reaction cycle. Subsequent reaction cycles add layers to the substrate. Therefore, ALD is an ideal process for microelectronics where a known thickness and tolerance is measurable. Typically, ALD layers create an epitaxial growth using a single crystal or multi-crystalline structure. But ALD has not previously been developed for diamond production due in part to current limitations in known processes, such as the deposition rate being too slow. Thus, it would be advantageous to provide a method and apparatus for growing diamond layers to repair a diamond's internal imperfections, or for growing other gemstone layers.

The process of ALD is a technology which enables the deposition of one atomic or molecular layer of a material in each cycle of the process. Many layers may be deposited by running many cycles of the process. Depending on the parameters of the process and the substrate, the layers such deposited can create an Epitaxial growth creating a single crystal or multi crystalline structure. The present disclosure relates to methods to improve the optical quality and value of diamonds, and other gemstones, by reducing and/or eliminating internal defects. ALD manufacturing equipment and manufacturing methods are generally known. See, e.g. http://en.wikipedia.org/wiki/Atomic_layer_deposition, www.beneq.com, www.oxford-instruments.com, www.cambridgenanotech.com, www.sundewtech.com, which are incorporated by reference in their entirety.

ALD of Carbon is described in U.S. Pat. No. 5,281,274 ("'274 patent") to Yoder, entitled "Atomic Layer Epitaxy (ALE) Apparatus for Growing Thin Films of Elemental Semiconductors," the entire disclosure of which is incorporated herein by reference, with sufficient details to enable crystalline diamond deposition one single atomic layer at a time. Although the '274 patent calls the process ALE (Atomic Layer Epitaxy), the current or common technical term for the process disclosed by the '274 patent is ALD. A typically sequence of the ALE/ALD process is described in relation to Example 1 of the '274 patent, and although this sequence is described for single layer crystalline diamond formation on a substrate for forming an elemental Carbon, the sequence of Example 1 may be followed and repeated for multiple-layer growth of crystalline diamond. U.S. Pat. No. 5,404,835 issued to Yoder, entitled "Method of Making Large Area Single Crystalline Diamond Films," is also incorporated by reference herein in its entirety for the purpose of demonstrating the process steps for growing diamond layers in a reaction chamber.

The following additional patent references are all incorporated by reference herein in their entireties: U.S. Pat. No. 7,258,741 issued to Linares et al., entitled "System and Method for Producing Synthetic Diamond"; U.S. Pat. No. 7,201,886 issued to Linares et al., entitled "Single Crystal Diamond Tool"; and U.S. Pat. No. 5,814,149 issued to Shintani et al., entitled "Methods for Manufacturing Monocrystalline Diamond Films."

There are other benefits from using ALD to form layers in diamonds, including but not limited to providing consistent and reliable atomic structures, and achieving conformal layers for correcting flaws in diamonds and gemstones on an atomic or molecular scale.

Thus, according to a preferred embodiment, a diamond possessing at least one flaw may be treated by ALD processes by completing the following steps. The first step is to inspect the diamond to detect inclusions, cracks, vacant volumes, holes etc. In the second step, any inclusion(s) detected in the first step will be treated, preferably by drilling a hole to the inclusion with a laser beam and dissolving the inclused matter with one or more hot acids. Next, any confined cracks, holes and/or vacant volumes will have a pathway formed from the exterior surface of the diamond to the defect, preferably by laser drilling as well. In the final step, the diamond is placed in a reaction chamber such as an ALD process chamber and exposed to precursor materials as required to form additional diamond layers on the surface of the defects. The ALD process may continue until one or several single atomic crystal layers are formed on the surfaces of the defects. The ability of ALD deposition to penetrate deep voids and create conformal coating in very confined spaces is critical to the invention described herein. Other deposition technologies such as CVD can not archive such performance. The outside surface of the diamond will be coated as well, increasing the diamond total weight.

Thus, according to one embodiment, a method for forming atomic layers on the surface of a gemstone is disclosed, which comprises the steps of:

1) placing at least one gemstone in an ALD reaction chamber, the at least one gemstone having at least one exposed surface;
2) evacuating air from the reaction chamber;
3) exposing the first precursor to the at least one gemstone;
4) purging or evacuation of the reaction chamber to remove the non-reacted precursor and the gaseous reaction by-products;
5) exposing the second precursor to the at least one gemstone;
6) purging or evacuation of the reaction chamber; and
7) repeating steps (3)-(6) to form additional atomic layers.

Each repeat of steps 3-6 above constitute a single reaction cycle. Each reaction cycle adds a given amount of material to the surface, referred to as the growth per cycle. To grow a material layer, reaction cycles are repeated as many as required for the desired film thickness. One cycle may take time from 0.5 s to a few seconds and deposit between 0.1 and 3 Å of film thickness depending on the specific ALD technology and equipment, and on the gemstone composition.

According to yet another embodiment, the method described in the preceding paragraph may be used to grow new layers of a gemstone on the surface of a substrate in an ALD reaction chamber for forming a new gemstone having a desired geometrical and optical configuration.

According to yet another alternative embodiment, a thin single crystal diamond of high purity C(12) may be formed by the process described above, for use as an improved heat sink for electronics and/or diode lasers.

It will be appreciated by those skilled in the art that the concepts presented herein are applicable for use with a variety of gemstones other than diamonds and those others listed above, including but not limited to rubies, sapphires, emeralds, amethysts, garnets, aquamarines, opals, peridot, topaz, citrines, tanzanite, tourmaline, quartz, jade, turquoise, onyx, and spinel, to name a few. It is also to be understood that the present invention includes a variety of different versions or embodiments, and this Summary is not meant to be limiting or all-inclusive. That is, this Summary provides general descriptions of certain embodiments, but may also include more specific descriptions of certain other embodiments. For example, the concepts addressed herein are applicable to both the methods of manufacturing or correcting defects in gemstones, and to the completed gemstones created as a result of those methods as well.

Accordingly, various embodiments of the present invention are illustrated in the attached figures and described in the detailed description of the invention as provided herein and as embodied by the claims. It should be understood, however, that this Summary does not contain all of the aspects and embodiments of the present invention and that the invention as disclosed herein is and will be understood by those of ordinary skill in the art to encompass obvious improvements and modifications thereto.

Additional advantages of the present invention will become readily apparent from the following discussion, particularly when taken together with the accompanying drawings.

Figure 1:
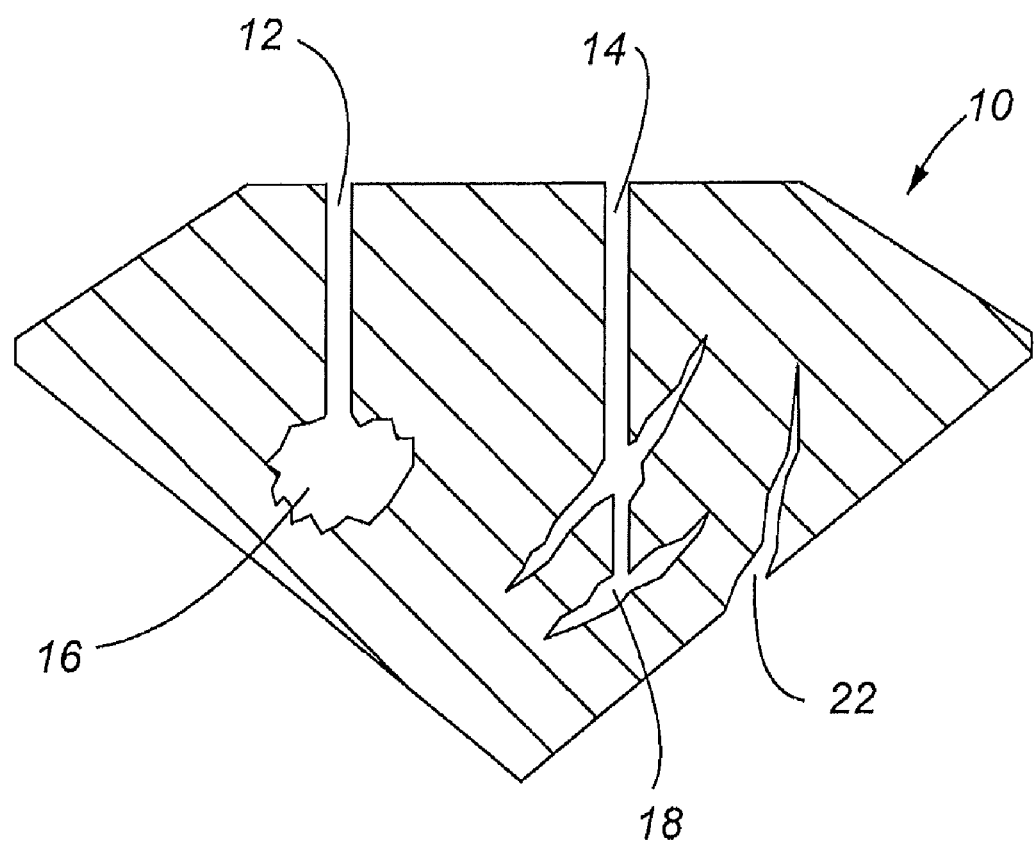
FIG. 1 is a cross-sectional view of a diamond having flaws prior to correction by Atomic Layer Deposition processes.

The drawings are not necessarily to scale and may be exaggerated in some instances to emphasize certain portions of the present disclosure.

DETAILED DESCRIPTION OF THE PREFERRED EMBODIMENTS

As discussed above, ALD is a manufacturing technique that allows one or more layers of atomic-scale materials to be deposed on a surface, and has several benefits over other methods, including but not limited to operating at low pressures and temperatures, providing consistent and reliable atomic structures, and achieving tolerances for correcting flaws in gemstones on an atomic or molecular scale (See Appendix A to the U.S. Provisional Patent Application No. 61/028,411 for additional information on ALD). A typical ALD process may be summarized as comprising multiple cycles, with each cycle comprising at least two precursor stages (where at each stage one precursor material is introduced).

In the first at least one precursor stage, the selected precursor is introduced in to a reaction chamber for the purpose of reacting with a material. For example, methane ($CH_4$) may be used as the first precursor. The first precursor stage continues until the surface of the material is. passivated. Following the reaction of the first precursor with the material, any excess precursor or undesired byproduct is purged from the chamber.

In the at least second precursor stage, a second precursor element is introduced in to the reaction chamber for the purpose of reaction with the first precursor. Using the example above, carbon tetrafluoride ($CF_4$) may be introduced to the chamber during the second stage. After the second precursor has been introduced and the surface has again passivated, the excess materials are purged from the reaction chamber. The completion of two precursor stages is typically referred to as one cycle. In each cycle, a layer of crystalline diamond will be formed.

For the deposition of diamond layers, the first precursor is, for example, either hydrogen or a hydride gas having molecules composed of hydrogen and carbon atoms, e.g., methane ($CH_4$) and the second precursor can be either a halogen or a halide gas having molecules composed of a halogen and carbon, e.g., carbon tetrafluoride ($CF_4$).

Some ALD processes comprise multiple cycles, on the scale of hundreds or thousands, in order to form the desired thickness of the deposed material. As each layer is consistently and uniformly deposed on to the material surface and each preceding layer of material, the desired thickness may be accurately and consistently controlled. The deposed layers are conformal to the surface of the material even behind blind corners and in hard to reach locations, due to the self-limiting property of the process. The ALD process may be monitored and controlled by a number of known control logic hierarchies, such as PC-based, PLC (programmable logic controller) based, or by other control means (See Appendix A to the U.S. Provisional Patent Application No. 61/028,411).

The reaction chamber may be a simple, configured gas-flow atomic layer deposition reactor comprising only a single chamber for forming crystalline layers on a diamond surface. According to a preferred embodiment, a single chamber ALD reactor further comprises at least one vacuum pump for pumping away air after first sealing the chamber and for purging the chamber between precursor introductions, and for removing reaction by-products and unused or unreacted material. This vacuum pump may be controlled by an automated system to regulate pressure within the reactor.

ALD may be used to create additional layers within the interior of or about a surface of a diamond. A single diamond layer may be deposited and patterned in a variety of ways, as explained in greater detail herein. Subsequent diamond layers may then be deposited and patterned as necessary. Entirely new diamonds may be formed using ALD to create the necessary layers of the desired shape, size and thickness of the diamond. The ALD process may be used for manufacturing or correcting other gemstones as well.

According to one embodiment of the present disclosure, a diamond having vacant volumes, cracks, and/or other flaws may be repaired or corrected by ALD processes to form additional crystalline layers in the flawed areas. The processes may be similar to the typical ALD process described above, and may include only a single cycle for deposing one atomic layer or several thousand cycles for deposing additional layers of material within the vacant volumes, cracks or flaws in the diamond. According to a preferred embodiment, the processes may be used for flaws of almost any shape and size in a diamond or other gemstone. In a diamond with particularly narrow cracks and vacant volumes, the relatively slow deposition rate of ALD is not a problem, due to the small thickness and narrow volumes that are required to be deposited in order to substantially improve the quality of the diamond. If larger flaws are found in the diamond, either internally or on the surface of the diamond, additional layers of material may be formed in those flaws by performing additional steps of the ALD process as required for the thickness of the material layer desired.

According to various embodiments disclosed herein, a diamond having one vacant volume and multiple cracks is shown in the cross-sectional view of FIG. 1. The diamond 10 in FIG. 1 is depicted after the cutting and polishing process, but a rough diamond may be treated as well. A narrow pathway 12 to the vacant volume 16 has already been formed by laser drilling.

Such laser drilling is achievable by polishing only one flat surface on a rough diamond and drilling from this surface. This pathway 12 is necessary to allow the precursor material introduced during each cycle in the reaction chamber to reach the vacant volume(s) 16 and permit the precursor materials to bond with the surface area of said vacant volume(s) 16. The pathway 12 may be drilled to be wider or narrower than depicted in FIG. 1 as necessary to permit the necessary number of cycles to completely fill the vacant volume(s) 16. Alternatively, less than the entire volume of the vacant volume(s) 16 may be filled using ALD processes, and still achieve many of the benefits discussed in the Background section of the present application. Further alternatively, a pathway 12 may be drilled in such a diameter that will be filled up before the vacant volume 16 is fully filled by the ALD deposition, and later a second pathway drilled and the deposition process repeated, etc, etc. A similar pathway 14 may be laser drilled to permit diamond layers to be formed on cracks 18 within the diamond 10. Alternatively, a crack 22 on the exterior of the diamond 10 may similarly be treated without the need for drilling.

In at least one alternate embodiment, a similar process can be performed on an uncut gemstones such as an uncut diamond crystal by polishing one flat facet, which in turn permits inspection of the interior of the diamond. Thus, uncut diamonds and other gemstones may be corrected prior to the final cutting and polishing to prepare the diamond for sale or use.

Thus, according to a preferred embodiment, a diamond possessing at least one flaw may be treated by ALD processes by completing the following steps. The first step is to inspect the diamond to detect inclusions, cracks, vacant volumes, holes etc. In the second step, any defect(s) detected in the first step will be treated, preferably by drilling a hole to the defect with a laser beam and dissolving the included matter with one or more hot acids. Confined cracks, holes and vacant volumes will then have a pathway formed from the exterior surface of the diamond to the defect, preferably by laser drilling as well. In the final step, the diamond is placed in a reaction chamber such as an ALD process chamber and exposed to precursors materials as required to form additional diamond layers on the surface of the defects. The ALD process may continue until one or several single atomic layers are formed on the surfaces of the defects. The process may be repeated as required.

According to a preferred embodiment, the process above may be reduced to the following steps for forming atomic diamond layers on at least one surface of a diamond:

1) placing at least one gemstone in an ALD reaction chamber, the at least one gemstone having at least one exposed surface;

2) evacuating air from the reaction chamber;

3) exposing the first precursor to the at least one gemstone;

4) purging or evacuation of the reaction chamber to remove the non-reacted precursors and the gaseous reaction by-products;

5) exposing the second precursor to the at least one gemstone;

6) purging or evacuation of the reaction chamber; and 7) repeating steps (3)-(6) to form additional atomic layers.

According to an alternate embodiment, a method for forming atomic layers on the surface of a gemstone, other than a diamond, comprises similar steps but using different precursor materials according to the gemstone composition.

In yet another embodiment, the steps above are repeated for constructing a synthetic gemstone, such as by way of example but not limitation, a synthetic diamond. Various atomic layers of synthetic material may be deposed in a reaction chamber onto a small gemstone (seed) until a large gemstone is produces. Alternatively, a seed made of inexpensive material with similar crystalline constant as the desired gemstone may be used. For example, nickel crystal can be used as a seed for growing a larger diamond due to the similar crystalline constant.

Figure 2:
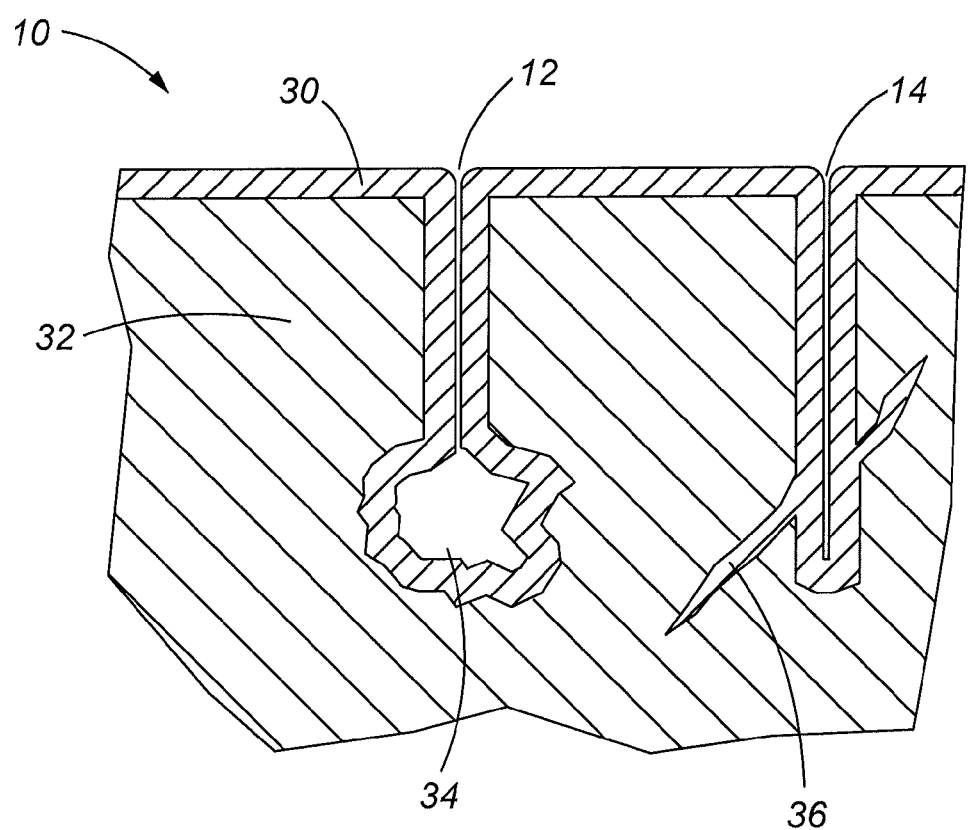
FIG. 2 is a partial cross-sectional view of the diamond shown in FIG. 1 after Atomic Layer Deposition processes have begun.

Referring now in detail to FIG. 2, a diamond 10 cut-away with the pathway 12 to the vacant volume 34 in the diamond 10 nearly closed off ("pinched") is shown. As seen in FIG. 2, any defect that is narrow then the diameter of the pathway 12 drilled to it will be fully filled. For example, if the pathway 12, 14 is 100 micrometer in diameter, then cracks 36 and vacant volumes 34 up to 100 micrometers in width/diameter will be fully filled. For cracks that are exposed to the surface of the diamond 10, drilling a pathway is not necessary, but may be desired for accessing portions of the crack(s) that may be wider in the interior of the diamond than at the diamond's surface.

According to one alternative embodiment, multiple drilling and ALD process steps may be employed in a repeatable fashion until the flaws have been fully filled. For example, a diamond having flaws, such as vacant volumes, larger then 100 micrometers in diameter or width, a second hole may be laser drilled and a second ALD procedure may be administered once the first pathway has been pinched-off by the previous ALD process. This alternating ALD and drilling process may repeat until the hole or crack is fully filled.

The ability of ALD process to properly coat atomic layers in very controlled thickness inside very deep trenches (as commonly used in semiconductor chip manufacturing) guarantee that the drilled hole will not be clogged at the opening, as would be the case in CVD process. The drilled hole does not cause a problem even if it does not close completely, since the hole left will be substantially smaller in diameter then the wavelength of visible light and there will be almost no optical reflection from the hole, thereby making the hole invisible. If desired, a substantially conical-shaped pathway having a first diameter of approximately 100 micrometers (at the bottom of the cone) and a second diameter of approximately 110 micrometers at the top will enable complete filling of the hole.

Exposed cracks and other defects will be filled up without the need for laser drilling if the opening is larger then any inside width.

According to yet another embodiment of the present disclosure, ALD process described herein may be used to create a synthetic diamond. There are alternative methods for creating a synthetic diamond, such as by a hot filament method, a plasma method, and a photo-assisted method. However, each of these methods use carbonaceous gas and are costly and often inefficient. Other known methods for forming synthetic diamonds, such as the ion beam method have not demonstrated accurate crystalline structures, and therefore are flawed. ALD on the other hand, produces a consistent, atomic deposed material layer that may be repeated to form additional material layers, each on top of the previously deposed layer. Depending on the process parameters and the substrate material, single crystal or multi-crystalline diamonds may be manufactured using this ALD process.

ALD processes, such as the ones described herein, may be employed in the manufacture of bulk diamonds. For example, a small diamond (commonly referred to as a "seed") may be coated with many ALD layers to create a larger diamond. According to one alternative embodiment, the "seed" diamond may be a natural or synthetic diamond. Alternatively, a seed made of inexpensive material with similar crystalline constant as the desired gemstone may be used. For example, nickel crystal can be used as a seed for diamond due to the similar crystalline constant.

According to yet another alternative embodiment, a thin seed may be coated with high purity C(12), which is known to have substantially higher thermal conductivity than other crystal diamonds. Such high purity coated diamonds may be used as an improved heat sink for electronics and/or diode lasers.

Impurities may be included to make a specific signature of the repaired area. The impurity atoms may be mixed with the Carbon atoms at a certain ratio. Alternatively, layers of atoms different from Carbon may be used to color the diamond or for creating special signature for distinction of the synthetically made diamonds from natural diamonds. The signature may be spectroscopic in nature, as the impurities atoms may be detected by their absorption or emission spectrum, or diffraction, where the separation between layers creates a diffraction pattern of transmitted or reflected light, as the layers will create a volume grating. Small number of layers of impurities will create stressed layers that keep the crystalline constant the same as the original gemstone.

Filling up voids in diamonds will be superior to glass filling, as the filling will have the same hardness as the original diamond, will have the same optical properties and will not be visible unless specifically and intentionally made to be visible. ALD has additional benefits over other known methods, such as glass injection and CVD, including but not limited to providing consistent and reliable atomic structures, and achieving tolerances for correcting flaws in gemstones on an atomic or molecular scale.

The foregoing discussion of the invention has been presented for purposes of illustration and description. The foregoing is not intended to limit the invention to the form or forms disclosed herein. In the foregoing Detailed Description for example, various features of the invention are grouped together in one or more embodiments for the purpose of streamlining the disclosure. This method of disclosure is not to be interpreted as reflecting an intention that the claimed invention requires more features than are expressly recited in each claim. Rather, as the following claims reflect, inventive aspects lie in less than all features of a single foregoing disclosed embodiment. Thus, the following claims are hereby incorporated into this Detailed Description, with each claim standing on its own as a separate preferred embodiment of the invention.

While various embodiments of the present invention have been described in detail, it is apparent that modifications and adaptations of those embodiments will occur to those skilled in the art. However, it is to be expressly understood that such modifications and adaptations are within the spirit and scope of the present invention, as set forth in the following claims.

What is claimed is:

1. A method for filling voids in a gemstone comprising the steps of:

placing at least one gemstone in a reaction chamber, the gemstone having at least one void which volume is connected to the volume of the reaction chamber by a channel drilled from the surface of the gemstone to the void; and depositing at least one atomic or molecular layer on the surface of the at least one void by Atomic Layer Deposition.

2. The method of claim 1 wherein the gemstone is a diamond.

3. The method of claim 1, wherein the gemstone is selected from the group consisting of a diamond, a ruby, a sapphire, an emerald, an amethyst, a garnet, an aquamarine, an opal, a peridot, a topaz, a citrine, a tanzanite, a tourmaline, a quartz, a jade, a turquoise, an onyx, and a spinel.

4. A diamond with flaws filled by the method of claim 1.

5. A gemstone other than a diamond with flaws filled by the method of claim 1.

* * * * *